United States Patent
Cebuhar et al.

(10) Patent No.: US 6,831,768 B1
(45) Date of Patent: Dec. 14, 2004

(54) USING TIME AND/OR POWER MODULATION TO ACHIEVE DOSE GRAYSCALING IN OPTICAL MASKLESS LITHOGRAPHY

(75) Inventors: Wenceslao A. Cebuhar, Norwalk, CT (US); Jason D. Hintersteiner, Bethel, CT (US); Azat Latypov, Danbury, CT (US); Gerald Volpe, Stamford, CT (US)

(73) Assignee: ASML Holding N.V., Veldhoven (NL)

(*) Notice: Subject to any disclaimer, the term of this patent is extended or adjusted under 35 U.S.C. 154(b) by 0 days.

(21) Appl. No.: 10/630,871

(22) Filed: Jul. 31, 2003

(51) Int. Cl.[7] .................. G02B 26/00; G02B 26/08; G03B 27/54; G03B 27/72
(52) U.S. Cl. .................. 359/291; 355/67; 355/71; 359/224; 359/855
(58) Field of Search .................. 355/18, 35, 44, 355/53, 66, 67, 71; 359/224, 291, 855

(56) References Cited

U.S. PATENT DOCUMENTS 6,097,361 A   8/2000   Rohner .................. 345/87
6,312,134 B1 * 11/2001   Jain et al. .................. 359/855

FOREIGN PATENT DOCUMENTS

WO    WO 98/04950    2/1998    .......... G02B/26/00

* cited by examiner

Primary Examiner—David N. Spector
(74) Attorney, Agent, or Firm—Sterne, Kessler, Goldstein & Fox P.L.L.C.

(57) ABSTRACT

In lithography applications, it is desirable to control, for example, a position or width of a printed line. An effective method of controlling these patterns and their resolution is by having as many grayscale levels as possible. The present invention comprises methods of grayscaling wherein modulation of the exposure time increases the number of grayscale levels on an object. In addition, the present invention comprises methods of grayscaling wherein modulating the power of an exposure beam provides additional grayscale levels.

21 Claims, 12 Drawing Sheets

USING TIME AND/OR POWER MODULATION TO ACHIEVE DOSE GRAYSCALING IN OPTICAL MASKLESS LITHOGRAPHY

BACKGROUND OF THE INVENTION

1. Field of the Invention

The present invention is directed generally to lithography. More particularly, the present invention relates to maskless lithography.

2. Related Art

Lithography is a process used to create features on the surface of substrates. Such substrates can include those used in the manufacture of flat panel displays (e.g., liquid crystal displays), circuit boards, various integrated circuits, and the like. A frequently used substrate for such applications is a semiconductor wafer or glass substrate. While this description is written in terms of a semiconductor wafer for illustrative purposes, one skilled in the art would recognize that this description also applies to other types of substrates known to those skilled in the art.

During lithography, a wafer, which is disposed on a wafer stage, is exposed to an image projected onto the surface of the wafer by exposure optics located within a lithography apparatus. While exposure optics are used in the case of photolithography, a different type of exposure apparatus can be used depending on the particular application. For example, x-ray, ion, electron, or photon lithography each can require a different exposure apparatus, as is known to those skilled in the art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove or further process exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow imaging slot. Rather than expose the entire wafer at one time, individual fields are scanned onto the wafer one at a time. This is accomplished by moving the wafer and reticle simultaneously such that the imaging slot is moved across the field during the scan. The wafer stage must then be asynchronously stepped between field exposures to allow multiple copies of the reticle pattern to be exposed over the wafer surface. In this manner, the quality of the image projected onto the wafer is maximized.

Conventional lithographic systems and methods form images on a semiconductor wafer. The system typically has a lithographic chamber that is designed to contain an apparatus that performs the process of image formation on the semiconductor wafer. The chamber can be designed to have different gas mixtures and grades of vacuum depending on the wavelength of light being used. A reticle is positioned inside the chamber. A beam of light is passed from an illumination source (located outside the system) through an optical system, an image outline on the reticle, and a second optical system before interacting with a semiconductor wafer.

A plurality of reticles are required to fabricate a device on the substrate. These reticles are becoming increasingly costly and time consuming to manufacture due to the feature sizes and the exacting tolerances required for small feature sizes. Also, a reticle can only be used for a certain period of time before being worn out. Further costs are routinely incurred if a reticle is not within a certain tolerance or when the reticle is damaged. Thus, the manufacture of wafers using reticles is becoming increasingly, and possibly prohibitively expensive.

In order to overcome these drawbacks, maskless (e.g., direct write, digital, etc.) lithography systems have been developed. The maskless system replaces a reticle with a spatial light modulator (SLM) (e.g., a digital micromirror device (DMD), a liquid crystal display (LCD), or the like). The SLM includes an array of active areas (e.g., mirrors or transmissive areas) that are individually controlled to form a desired pattern. These active areas are also known in the art as "pixels." A predetermined and previously stored algorithm based on a desired exposure pattern is used to control the pixels. Each pixel in an SLM can vary its optical properties (e.g., amplitude/phase transmittance) in a controllable manner so as to provide a variation of a dose delivered to the wafer surface.

In a typical embodiment, each pixel can assume any of a limited number of discrete states, each corresponding to a certain level of dose grayscaling. One of the many states that the pixel can assume corresponds to the pixel sending no light to the exposure area. This state may be referred to as the dark state or the OFF state. Other states of the pixel correspond to the pixel being modulated so that it sends a certain fraction of the incident light to the exposure area. In order to be able to control the printed pattern (e.g., a position or width of a printed line), it is desirable to have as many grayscale levels as possible. However, the number of grayscale levels achievable by increasing the number of discrete pixel states is limited due to at least the following reasons.

A pattern on an SLM typically has to be updated for every laser pulse if the wafer scan is continuous with exposures occurring during the short laser pulses. If exposures are performed with a continuous light source, but the wafer is either at rest during the exposure or the smearing of the exposure is compensated, the pattern has to be updated at least very frequently. As a result, a high data transfer rate to the SLM has to be maintained. This data transfer rate increases proportionally to the logarithm of the number of discrete states, and the limitation on the maximum possible data transfer rate results in a limitation on the number of pixel states and number of grayscale levels.

Also, having a larger number of pixel states makes both the design of an SLM and the control over the states more difficult.

Therefore, what is needed is a maskless lithography system and method that would allow achieving a larger number of grayscale levels without increasing the number of distinct pixel states.

BRIEF SUMMARY OF THE INVENTION

The present invention is directed to producing a large number of grayscale levels in an illumination system without increasing the number of discrete pixel states in that system. This development provides precision control over features printed by the system, such as the position or the width of a line.

In one embodiment, the present invention provides a method of grayscaling in an illumination system including a laser, wherein changing the time duration of the laser pulse provides additional grayscale levels.

In another embodiment, the present invention provides a method of grayscaling in an illumination system including a spatial light modulator (SLM), wherein altering the time during which a pixel of the SLM is activated provides additional grayscale levels.

In yet another embodiment, the present invention provides a method of grayscaling in an illumination system, wherein variation of the power of an exposure beam provides additional grayscale levels.

In yet further embodiments of the present invention, various combinations of laser pulse duration, pixel activation timing, and laser power are employed.

Further embodiments, features, and advantages of the present invention, as well as the structure and operation of the various embodiments of the present invention, are described in detail below with reference to the accompanying drawings.

BRIEF DESCRIPTION OF THE FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Embodiments of the present invention provide a method for grayscaling in an illumination system, for example in a maskless lithography machine. The system and method can be used to increase control over features printed on a substrate, such as position or width of a line, while maintaining the number of discrete pixel states.

Maskless Lithography Systems

Figure 1:
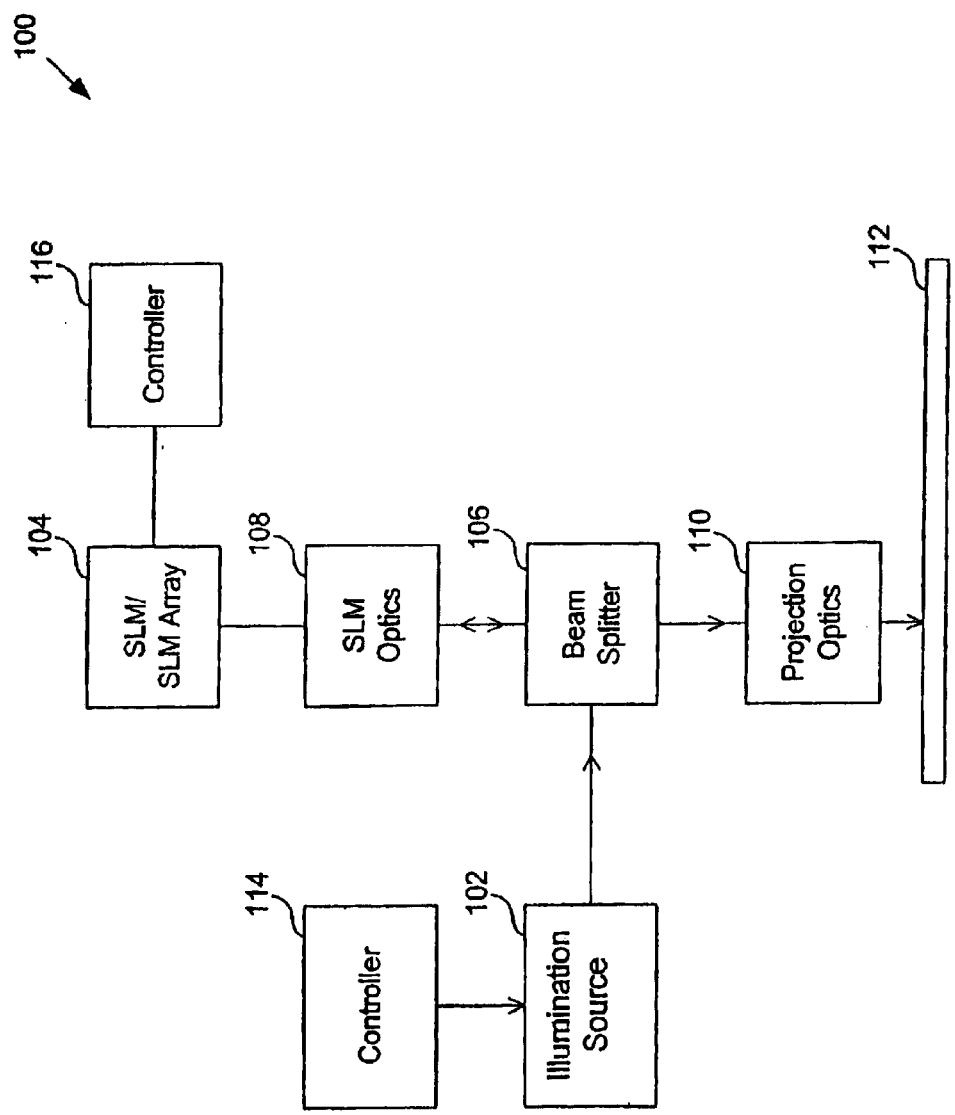
FIG. 1 shows a maskless lithography system having reflective SLMs, according to embodiments of the present invention.

FIG. 1 shows a maskless lithography system 100 according to an embodiment of the present invention. System 100 includes an illumination source 102 that transmits light to a reflective spatial light modulator (SLM) 104 (e.g., a digital micromirror device (DMD), a reflective liquid crystal display (LCD), or the like) via a beam splitter 106 and SLM optics 108. SLM 104 is used to pattern the light in place of a reticle in traditional lithography systems. Patterned light reflected from SLM 104 is passed through beam splitter 106 and projection optics 110 and written on an object 112 (e.g., a substrate, a semiconductor wafer, a glass substrate for a flat panel display, or the like).

It is to be appreciated that illumination optics can be housed within illumination source 102, as is known in the relevant art. It is also to be appreciated that SLM optics 108 and projection optics 110 car include any combination of optical elements required to direct light onto desired areas of SLM 104 and/or object 112, as is known in the relevant art.

In alternative embodiments, either one or both of illumination source 102 and SLM 104 can be coupled to or have integral controllers 114 and 116, respectively. Controller 114 can be used to adjust illumination source 102 based on feedback from system 100 or to perform calibration. Controller 116 can also be used for adjustment and/or calibration. Alternatively, controller 116 can be used for switching pixels 302 on SLM 104 between their discrete states (e.g., between one of their graytone states and the completely dark, or OFF state) (see FIG. 3). This can generate a pattern used to expose object 112. Controller 116 can either have integral storage or be coupled to a storage element (not shown) with predetermined information and/or algorithms used to generate the pattern or patterns.

Figure 2:
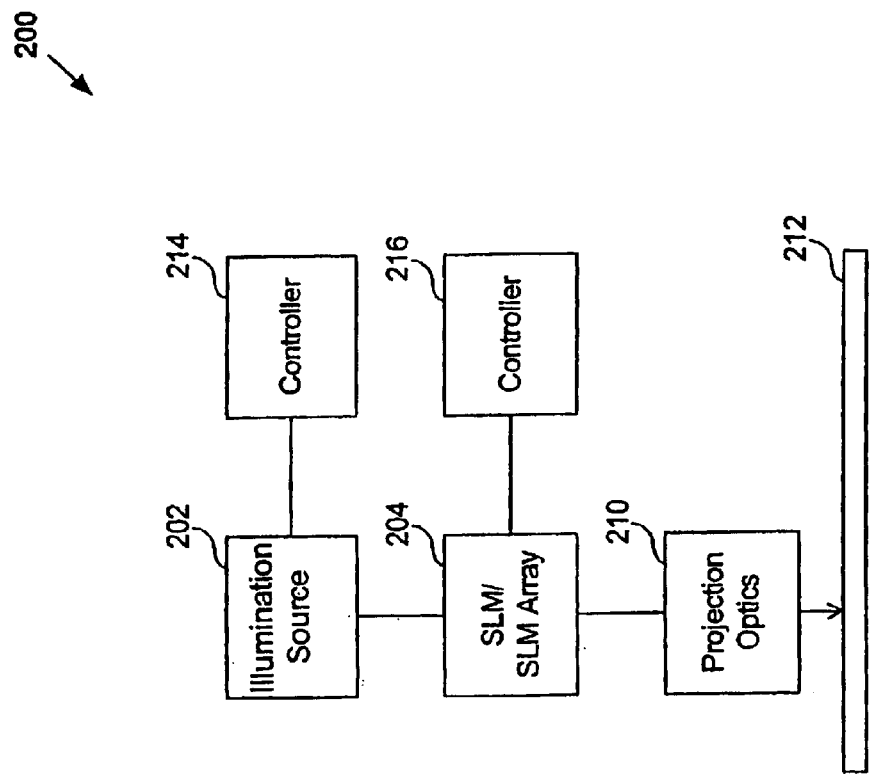
FIG. 2 shows a maskless lithography system having transmission SLMs, according to embodiments of the present invention.

FIG. 2 shows a maskless lithography system 200 according to a further embodiment of the present invention. System 200 includes an illumination source 202 that transmits light through a SLM 204 (e.g., a transmissive LCD, or the like) to pattern the light. The patterned light is transmitted through projection optics 210 to write the pattern on a surface of an object 212. In this embodiment, SLM 204 is a transmissive SLM, such as a liquid crystal display, or the like. Similar to above, either one or both of illumination source 202 and SLM 204 can be coupled to or integral with controllers 214 and 216, respectively. Controllers 214 and 216 can perform similar functions as controller 114 and 116 described above, and as known in the art.

Example SLMs that can be used in either of systems 100 or 200 are manufactured by Micronic Laser Systems AB of Sweden and Fraunhofer Institute for Circuits and Systems of Germany.

Merely for convenience, reference will be made only to system 100 below. However, all concepts discussed below can also apply to system 200, as would be known to someone skilled in the relevant arts. Other arrangements or integration of the components and controllers of FIGS. 1 and 2 will become apparent to one of ordinary skill in the art without departing from the spirit and scope of the present invention.

Figure 3:
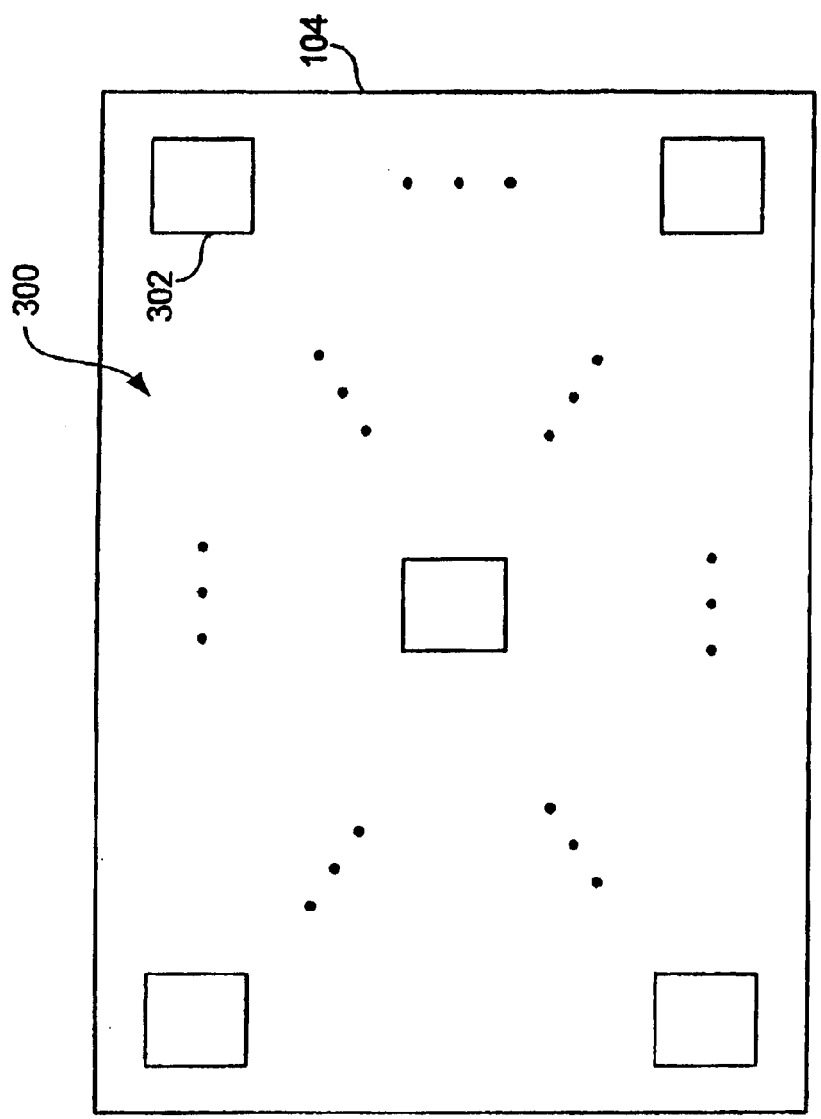
FIG. 3 shows an SLM, according to an embodiment of the present invention.

FIG. 3 shows details of an active area 300 of SLM 104, for example. Active area 300 includes an n×m array of pixels 302 (represented by ellipsis in the figure). Pixels 302 can be mirrors on a DMD or locations on a LCD. By adjusting the physical characteristics of pixels 302, they can be seen as being in one of their states. Digital or analog input signals based on a desired pattern are used to switch states of the various pixels 302. In some embodiments, an actual pattern being written to object 112 can be detected and a determination can be made whether the pattern is outside an acceptable tolerance. If so, controller 116 can be used to generate analog or digital control signals in real time to fine-tune (e.g., calibrate, adjust, etc.) the pattern being generated by SLM 104.

Figure 4:
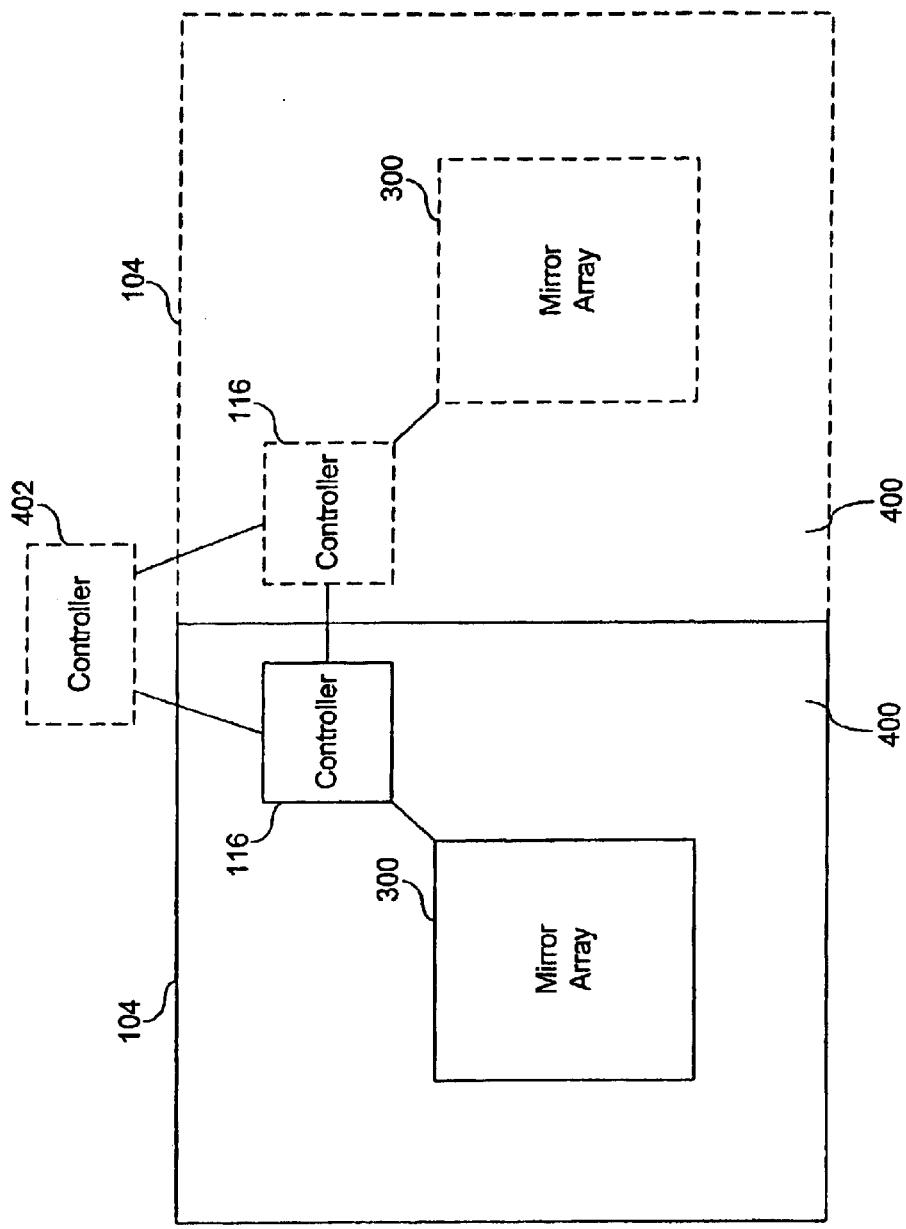
FIG. 4 shows more details of the SLM in FIG. 3.

FIG. 4 shows further details of SLM 104. SLM 104 can include an inactive packaging 400 surrounding active area 300. Also, in alternative embodiments, a main controller 402 can be coupled to each SLM controller 116 to monitor and control an array of SLMs. The dashed lines in FIG. 4 represent a second SLM in an array of SLMs. More than one SLM may be added to the array to suit the implementation design. As discussed below, adjacent SLMs may be offset or staggered with respect to each other in other embodiments.

SLM Array Configurations

Figure 5:
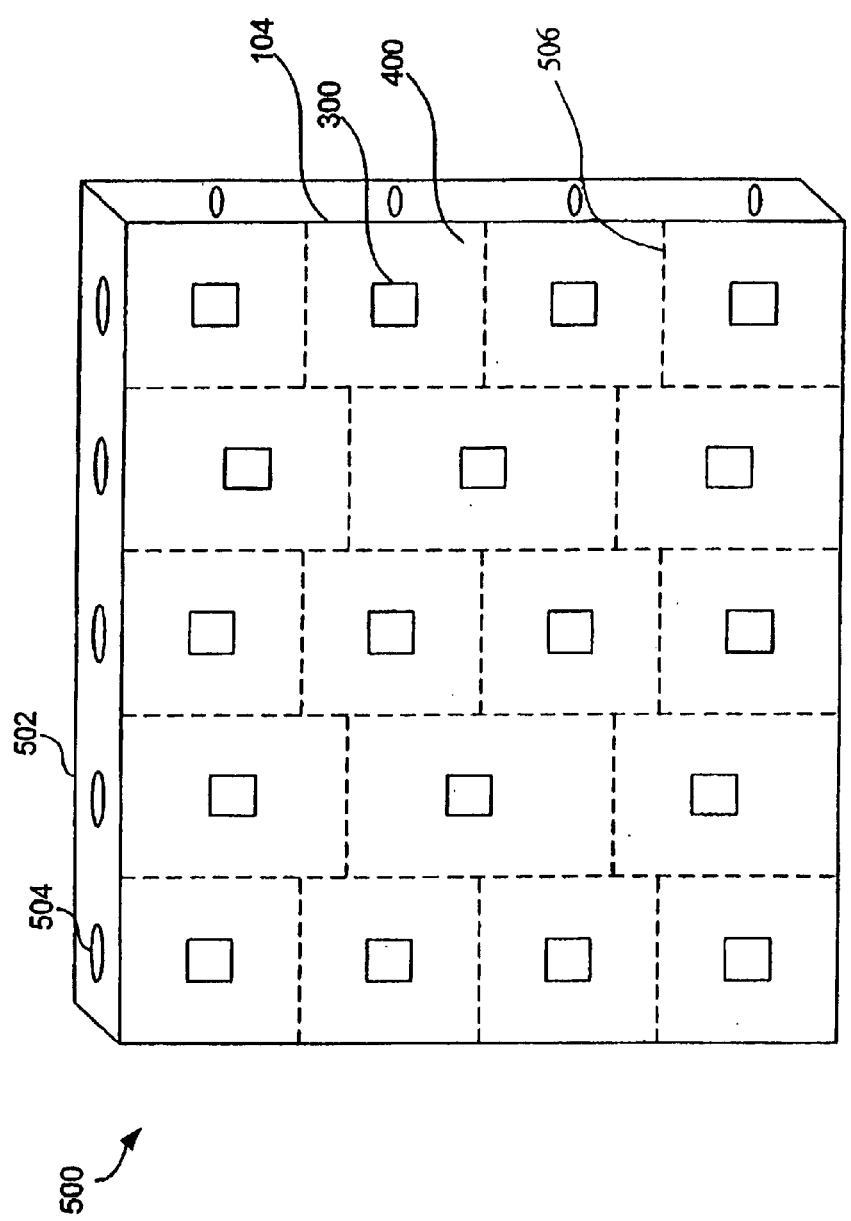
FIG. 5 shows an assembly according to embodiments of the present invention.

FIG. 5 shows an assembly 500 including a support device 502 that receives an array of SLMs 104. In various embodiments, as described in more detail below, the array of SLMs 104 can have varying numbers of columns, rows, SLMs per column, SLMs per row, etc., based on a number of desired exposures per pulse, or other implementation design criteria. The SLMs 104 can be coupled to a support device 502. Support device 502 can have thermal control areas 504 (e.g., water or air channels, etc.). Support device 502 may also have areas for control logic and related circuitry (e.g., see FIG. 4 showing elements 116 and element 402, which can be ASICs, A/D converters, D/A converters, fiber optics for streaming data, etc.). In addition, support device 502 can have windows 506 (formed within the dashed shapes) that receive SLMs 104, as is known in the relevant art. Support device 502, SLMs 104, and all peripheral cooling or control device circuitry are referred to as an assembly. Assembly 500 can allow for a desired step size to produce the desired stitching (e.g., connecting of adjacent elements of features on object 112) and overlap for leading and trailing SLMs 104. A leading SLM is the SLM that produces the first image in a series of images on object 112 during a scan, and a trailing SLM is the SLM that produces the last image in a series of images on object 112 during a scan. The overlap of the images from the leading and trailing SLMs 104 from different scans assists in removing seams that may result from adjacent, non-overlapping scans. By way of example, support device 502 can be 250 mm×250 mm or 300 mm×300 mm. Support device 502 can be used for thermal management based on being manufactured from a temperature stable material.

Support device 502 can be utilized as a mechanical backbone to ensure spacing control of SLMs 104 and for embedding the circuitry control and the thermal control areas 504. Any electronics can be mounted on either or both of a back side and a front side of support device 502. For example, when using analog based SLMs or electronics, wires can be coupled from control or coupling systems 504 to active areas 300. Based on being mounted on support device 502, these wires can be relatively shorter, which reduces attenuation of analog signals compared to a case where the circuitry is remote from the support device 502. Also, having short links between the circuitry and active areas 300 can increase communication speed, and thus increase pattern readjustment speed in real time.

In some embodiments, when SLM 104 or electrical devices in the circuitry wear out, assembly 500 can easily be replaced. Although it would appear that replacing assembly 500 is more costly than just a chip on assembly 500, it may in fact be more efficient to replace the entire assembly 500, which can save production costs. Also, assembly 500 can be refurbished, allowing for a reduction in replacement parts if end users are willing to use refurbished assemblies 500. Once assembly 500 is replaced, only an overall alignment is needed before resuming fabrication.

Grayscaling Using Time Modulation

For most lithography applications, it is desirable to control, for example, a position or width of a printed line. An effective method of controlling these patterns and increasing resolution is by having as many grayscale levels as possible.

Figure 6:
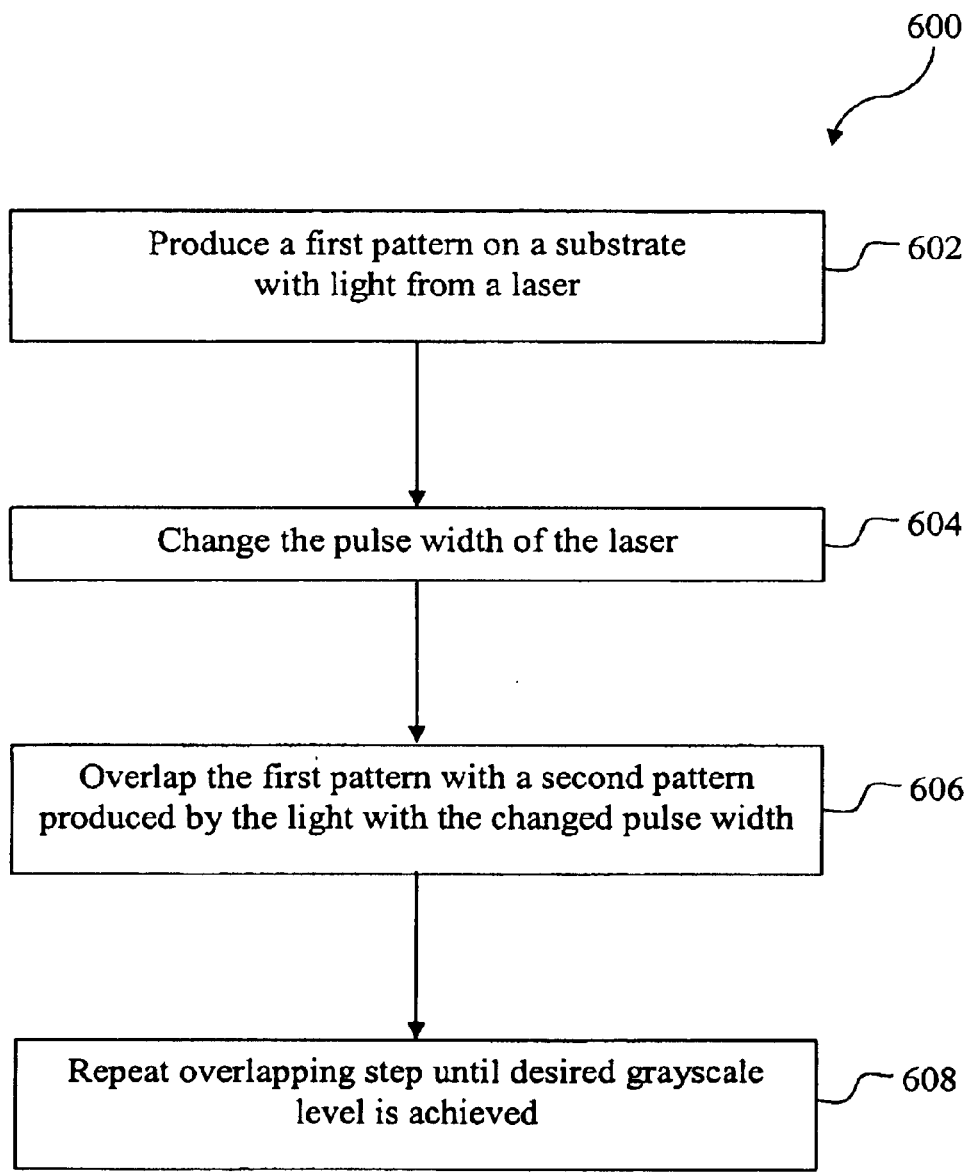
FIG. 6 is a flowchart representing a first embodiment of the method of grayscaling, wherein changing the time duration of the laser pulse provides additional grayscale levels, according to the present invention.

One approach to increasing the grayscale on an object is modulating the length of time during which the object is exposed to incoming light. FIG. 6 is a flowchart of one embodiment of the present invention in which the duration of an exposure is modulated. In this embodiment, illumination source 102 includes a laser (not shown). In step 602, light from illumination source 102 is transmitted by SLM 104 to form a first pattern on object 112.

Step 604 comprises changing the duration (e.g., pulse width) of a laser pulse from the laser in illumination source 102. For instance, if the laser beam is separated into multiple parallel beams, and the relative lengths of those parallel beams are changed, the duration of the pulse will also change. It will be obvious to one having ordinary skill in the art that any other method normally used to change the duration of a laser pulse can also be used in this embodiment.

In step 606, light from illumination source 102, this time with a different pulse width, is transmitted by SLM 104 to form a second pattern on object 102. The second pattern overlaps the first pattern. The overlapping pattern creates grayscale.

Step 608 comprises repeating step 606 until the desired grayscale level is achieved. Each time step 606 is repeated, a different range of grayscale levels can be produced. Combination of grayscales from different exposures gives additional grayscales.

Figure 7:
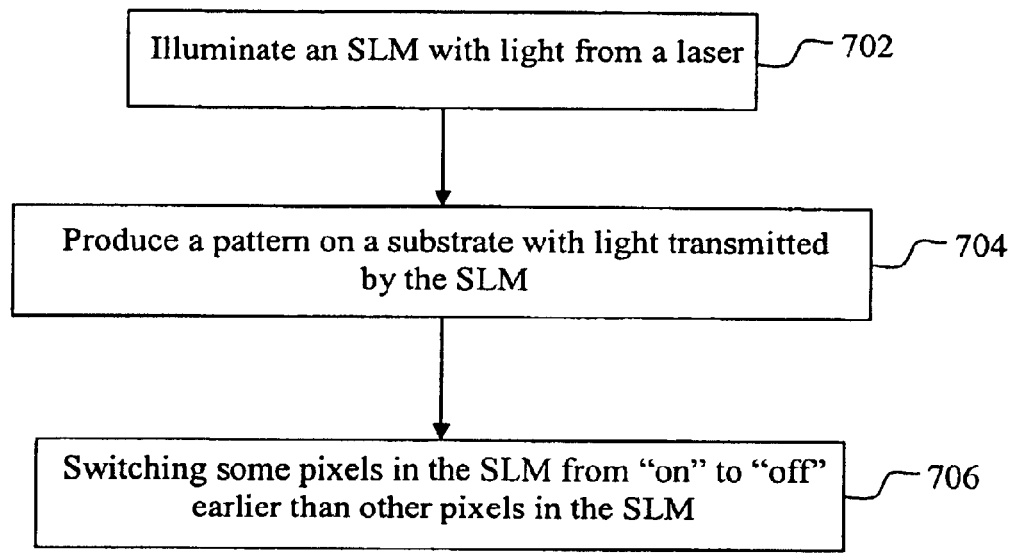
FIG. 7 is a flowchart representing a second embodiment of the method of grayscaling, wherein changing the time duration of a discrete state of a pixel provides additional grayscale levels, according to the present invention.

FIG. 7 represents a second embodiment of the present invention, in which the duration of an exposure is modulated. Step 702 comprises illuminating SLM 104 with light from illumination source 102. SLM 104 creates a pattern in the light.

In step 704, object 112 is exposed by the patterned light reflected from SLM 104.

Figure 10:
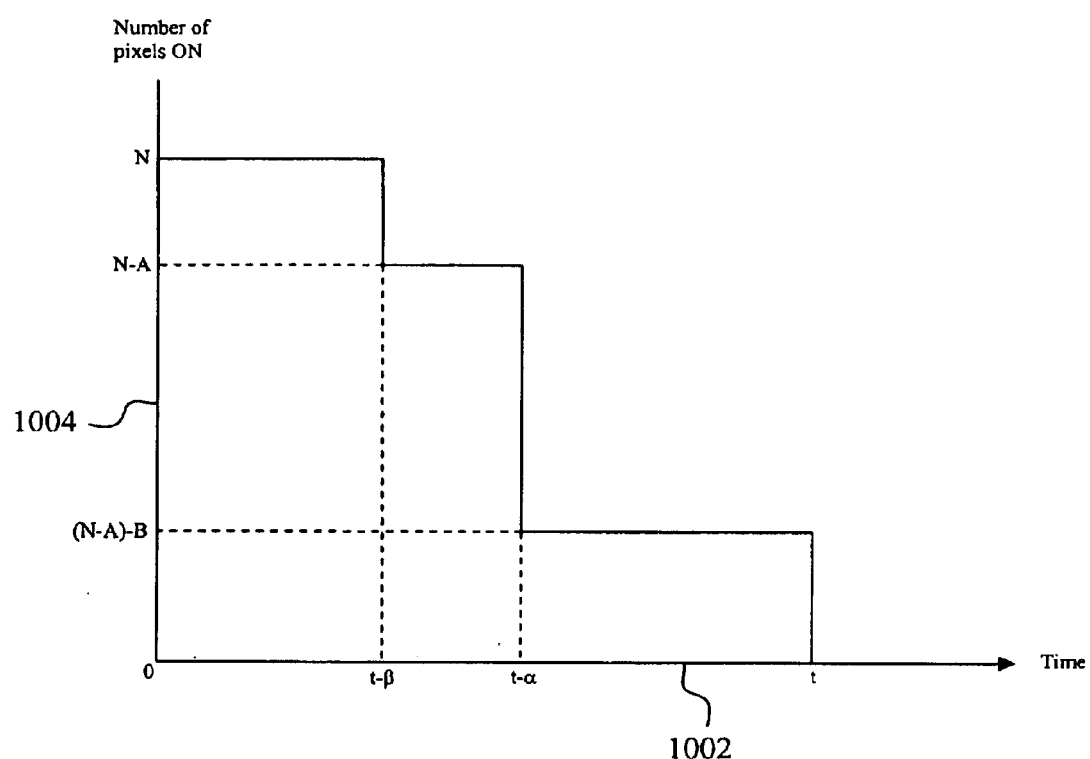
FIG. 10 is a timing diagram showing an example of changing the time duration of a discrete state of a pixel to provide additional grayscale levels.

Step 706 comprises creating levels of grayscale. This is achieved by switching a portion of pixels 302 of SLM 104 from one of their states to their secondary state earlier than other pixels 302 of SLM 104. The secondary state of a pixel may be a different grayscale state, in which the pixel sends a different fraction of the incident light to the exposure area. Alternatively, the secondary state to which the pixel switches may be its OFF state, where the pixel sends no light to the exposure area. Step 706 is further described in FIG. 10, which is a timing diagram of an example step 706. X-axis 1002 represents increasing time, with t representing the total time of one scan. Y-axis 1004 represents the number of pixels 302 of, for example, SLM 104 that are active at a given time. Assume at time 0 that a number N of pixels 302 are active. For simplicity, also assume that the secondary state of all pixels is the OFF state. One of skill in the art will recognize that other states may be used.

Part of the way through the scan, at time (t-β), a first portion A of pixels 302 switch to their OFF states. Therefore, immediately after time (t-β), (N-A) pixels remain in their active states. Later, at time (t-α), a second portion B of pixels 302 switch to their OFF states. Thus, immediately after time (t-α), ((N-A)-B) pixels remain in their active states. Finally, when the end of the scan is reached at time t, the remaining ((N-A)-B) pixels switch to their OFF states, leaving no pixels remaining in the active state.

Grayscaling Using Power Modulation

Figure 8:
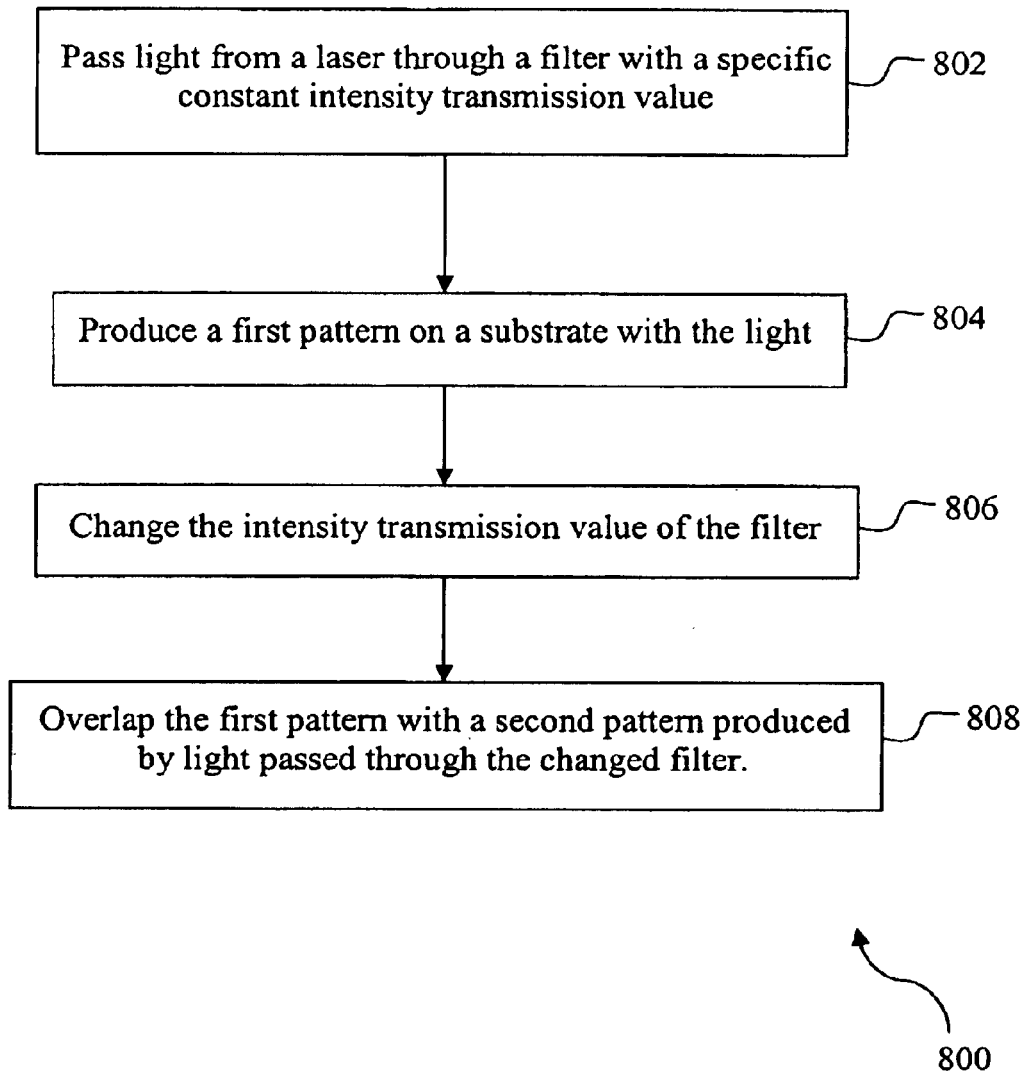
FIG. 8 is a flowchart representing a third embodiment of the method of grayscaling, wherein changing the power of a laser pulse provides additional grayscale levels, according to the present invention.

FIG. 8 represents method 800, a third embodiment of the present invention. In method 800, grayscaling is produced by modulating the power in each exposure. Method 800 is further supplemented by FIG. 11, a block diagram representing one embodiment of projection optics 110. In this embodiment, projection optics 110 includes a filter 1102 and additional optics 1104. One of skill in the art will recognize that additional optics 1104 may be placed in light path 1106 before, after, or on both sides of filter 1102. In addition, in further embodiments, filter 1102 may be placed anywhere in the optical path outside projection optics 110.

Figure 11:
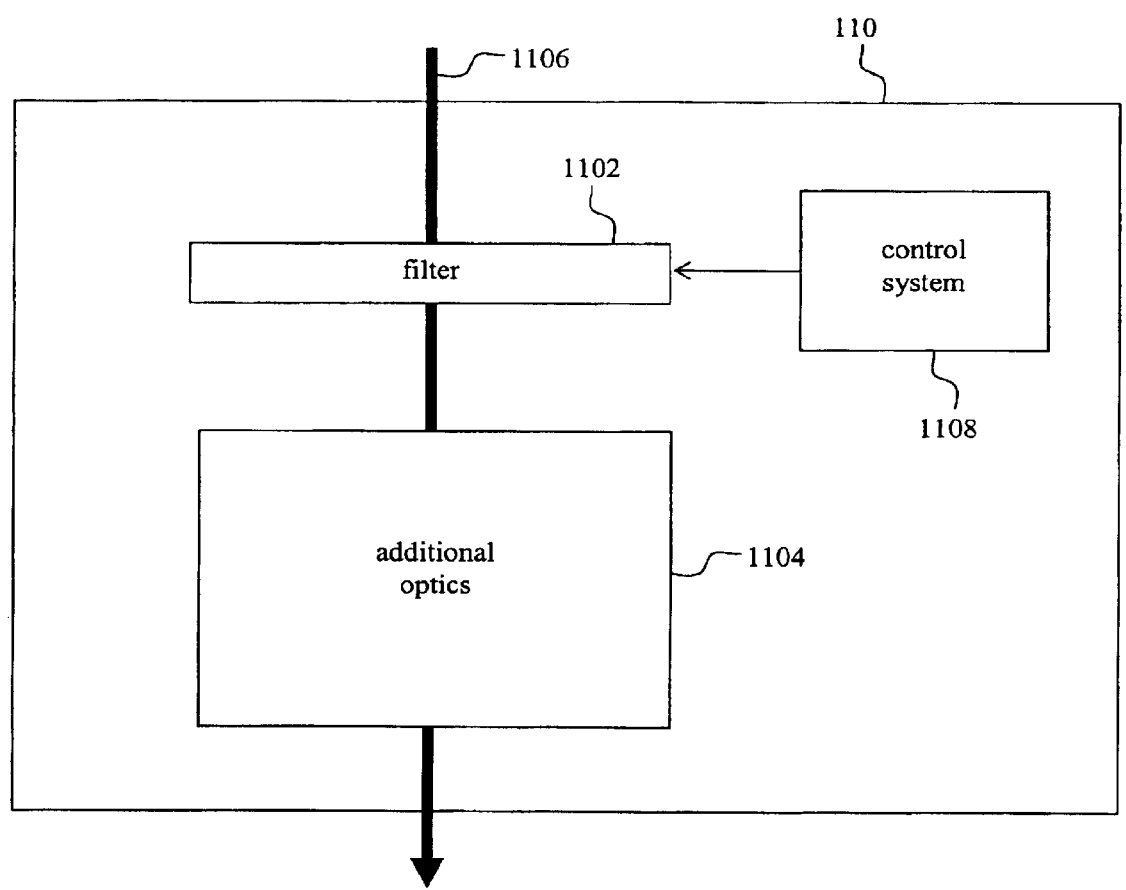
FIG. 11 is a block diagram representing one embodiment of projection optics 110.

In embodiment represented in FIG. 11, projection optics 10 may also include a control system 1108 for controlling, among other things, an intensity transmission value of filter 1102. Control system 1108 may be either manual or electronic. Control system 1108 may comprise, for example, a switch.

In method 800, step 802 comprises passing light from illumination source 102 through filter 1102 to create filtered light. Filter 1102 has a first intensity transmission value.

In step 804, the filtered light exposes object 112 to produce a first pattern on object 112.

In step 806, the intensity transmission value of filter 1102 is changed by, for example, control system 1108, so that filter 1102 has a second intensity transmission value.

Step 808 comprises overlapping the first pattern with a second pattern produced by light passing through filter 1102 with the second intensity transmission value. Exposing object 112 with a second pattern having a different intensity than the first pattern creates grayscale. Steps 806 and 808 may be repeated to increase the number of grayscale levels on object 112.

Figure 9:
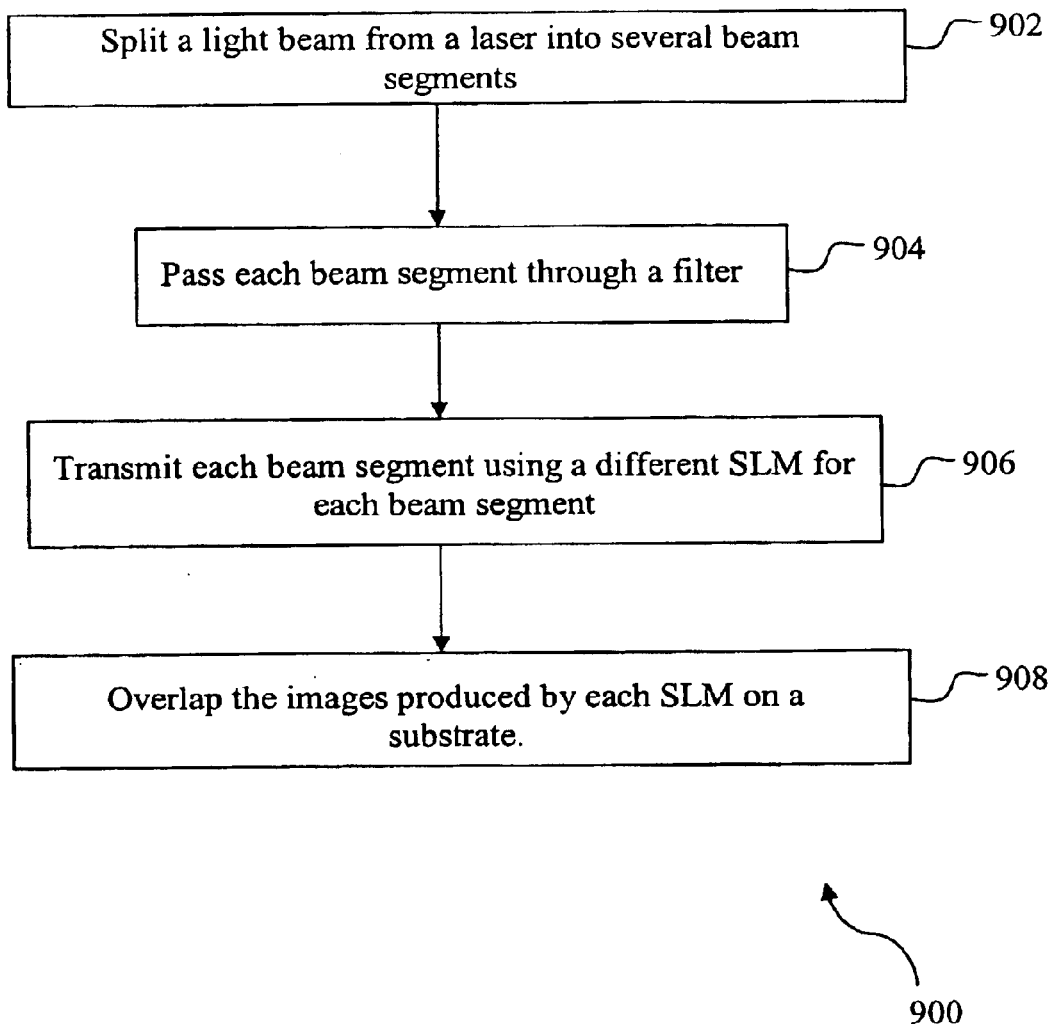
FIG. 9 is a flowchart representing a fourth embodiment of the method of grayscaling, wherein changing the power of individual beams from an illumination source provides additional grayscale levels, according to the present invention.
Figure 12:
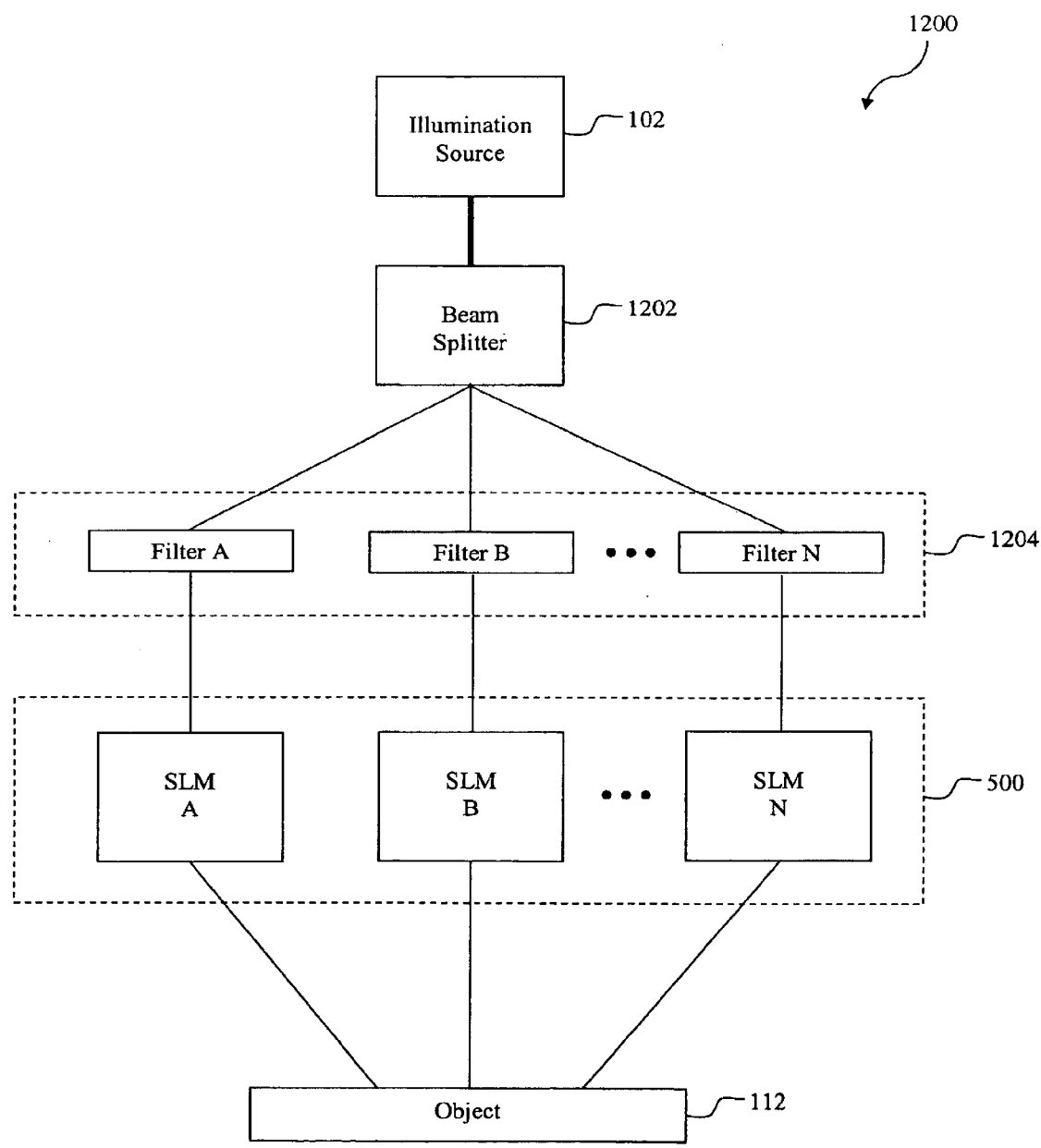
FIG. 12 is a block diagram representing an example system in which the present invention may be used.

FIG. 9 represents method 900, a fourth embodiment of the present invention. In method 900, grayscaling is produced by modulating the power in individual portions of a beam. Method 900 is further supplemented by FIG. 12, a block diagram comprising elements in a system 1200 that may be used by method 900. System 1200 comprises, among other elements, illumination source 102, a beam splitter 1202, a set of filters 1204, SLM assembly 500, and object 112. Set of filters 1204 may include filters A-N, represented by ellipsis in set of filters 1204. Similarly, SLM assembly 500 may include at least the same number of SLMs as the number of filters. For example, if there are N filters in set of filters 1204, there may also be N SLMs in SLM assembly 500.

In method 900, step 902 comprises splitting a light beam from illumination source 102 into more than one beam segments. The beam segments will be referred to as beam segments A-N.

In step 904, beam segments A-N are passed through corresponding filters A-N in set of filters 1204. Filters A-N modulate the power in each of corresponding beam segments A-N. After beam segments A-N pass through filters A-N, method 900 proceeds to step 906.

In step 906, beam segments A-N illuminate corresponding SLMs A-N in SLM assembly 500. Individual SLMs A-N in SLM assembly 500 then transmit the individual beam segments A-N to object 112.

Finally, in step 908, the individual beam segments expose object 112 in an overlapping manner. Since different patterns can be created in each of the beam segments by the individual SLMs A-N, some patterns may expose object 112 with a different intensity than other patterns. This exposure by multiple patterns with different intensities creates levels of grayscale on object 112. The number of grayscale levels may be increased by increasing the numbers of individual beam segments and individual SLMs used.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. In a maskless lithography system having a spatial light modulator (SLM), a method of producing grayscale on an object, said method comprising:

exposing the object with light to produce a pattern; and modulating an exposure time of the object to produce a range of grayscale levels on the object.

2. The method of claim 1, wherein said modulating step comprises varying the pulse width of a laser light source.

3. The method of claim 2, wherein the pattern is produced by the laser operating at a first pulse width, the method further comprising:

overlapping the pattern with a laser operating at a second pulse width to produce an overlapping exposure, wherein the second pulse width is different from the first pulse width, such that the overlapping exposure creates a different range of grayscale levels on the object.

4. The method of claim 3, wherein said overlapping step is repeated until a desired number of grayscale levels is achieved.

5. The method of claim 1, wherein the SLM has a plurality of pixels, the method further comprising before said exposing step:

switching the plurality of pixels between active states or from one active state to an OFF state, wherein an active state of a pixel corresponds to transmitting light to said object by that pixel at a particular gray level, and the OFF state corresponds to transmitting no light to said object by that pixel.

6. The method of claim 5, wherein said modulating step comprises:

switching a portion of the plurality of pixels of the SLM to alternate states earlier than other pixels in the SLM.

7. The method of claim 6, further comprising compensating for smearing of the pattern.

8. In a maskless lithography system having a spatial light modulator (SLM), a method of producing gray-scale on an object, said method comprising:

exposing the object with a light beam to produce a pattern; and modulating the power of the light beam to produce a range of grayscale levels on the object.

9. The method of claim 8, wherein the pattern is produced by a light beam having a first power, the method further comprising:

overlapping the pattern with a light beam having a second power to produce an overlapping exposure, such that the overlapping exposure creates a different range of grayscale levels on the object.

10. The method of claim 9, wherein said overlapping step is repeated until a desired number of grayscale levels is achieved.

11. The method of claim 10, wherein said overlapping step comprises:

passing the light beam through a filter with a constant intensity transmission value that is specific for the overlapping exposure; and transmitting said light beam to the object.

12. The method of claim 9, wherein said overlapping step comprises:

splitting the light beam into more than one beam;

passing each beam through a filter with a constant intensity transmission value;

transmitting each beam using its own individual SLM; and overlapping the images from each individual SLM on the object.

13. A maskless lithography system comprising:

an illumination source;

an object; and a controller, wherein the controller modulates the duration of time in which a light beam from the light source exposes the object to produce a range of grayscale levels on the object.

14. The maskless lithography system of claim 13, wherein said modulator varies the duration of time by varying the pulse width of a laser light source between successive exposures.

15. The maskless lithography system of claim 13, further comprising between the illumination source and the object:

a spatial light modulator (SLM), wherein the SLM has a plurality of pixels, and wherein an active state of a pixel corresponds to transmitting light to said object by that pixel at a particular gray level, and an OFF state corresponds to transmitting no light to said object by that pixel.

16. The maskless lithography system of 15, wherein said modulator varies the duration of time by switching at least one of the pixels in the SLM to at least one alternate state earlier than other pixels in the SLM.

17. A maskless lithography system comprising:

an illumination source that outputs a light beam;

a beamsplitter, that splits the light beam into a plurality of beams;

a plurality of filters, each filter corresponding to one of the plurality of beams and having a constant intensity transmission value; and a plurality of spatial light modulators (SLMs), each SLM corresponding to one of the plurality of beams, wherein each one of the plurality of beams passes through the corresponding filter and illuminates the corresponding SLM array, so that patterns produced by the plurality of SLMs are overlapped on the object.

18. The system of claim 17, further comprising:

a control system for controlling each pattern generated by each of the plurality of SLMs.

19. In a maskless lithography system having a spatial light modulator (SLM) with a plurality of pixels, a method of producing grayscale on an object, said method comprising:

exposing the object with a light beam to produce a pattern;

modulating an exposure time of the object to produce a first range of grayscale levels on the object; and modulating the power of the light beam to produce a second range of grayscale levels on the object.

20. The method of claim 19, wherein modulating an exposure time of the object comprises at least one of the group consisting of:

varying the pulse width of the light beam between exposures to produce overlapping exposures; and switching a portion of the plurality of pixels of the SLM to alternate states earlier than other pixels in the SLM.

21. The method of claim 19, wherein modulating the power of the light beam comprises at least one of the group consisting of:

varying the power of the light beam between exposures to produce overlapping exposures;

changing an intensity transmission value of a filter through which the light beam passes to produce overlapping exposures; and after splitting the light beam into a plurality of light beams, passing each beam through its own filter with a constant intensity transmission value.

* * * * *